United States Patent [19]
Wachter

[11] Patent Number: 6,144,246
[45] Date of Patent: Nov. 7, 2000

[54] CIRCUIT CONFIGURATION FOR SENSING WHEN A CRITICAL TEMPERATURE OF A COMPONENT HAS BEEN EXCEEDED

[75] Inventor: Franz Wachter, Villach, Austria

[73] Assignee: Infineon Technologies AG, Munich, Germany

[21] Appl. No.: 09/105,230

[22] Filed: Jun. 26, 1998

[30] Foreign Application Priority Data

Jun. 26, 1997 [DE] Germany .......................... 197 27 229

[51] Int. Cl.[7] .......................... H03K 17/14; G01K 7/14
[52] U.S. Cl. .......................... 327/513; 327/378; 361/103; 323/907
[58] Field of Search .................................. 327/512, 513, 327/378, 362; 361/103; 323/907, 315

[56] References Cited

U.S. PATENT DOCUMENTS

| | | | |
|---|---|---|---|
| 4,216,394 | 8/1980 | Leidich | 323/315 |
| 4,363,979 | 12/1982 | Hönig et al. | 327/306 |
| 4,503,381 | 3/1985 | Bowers | 327/535 |
| 4,613,772 | 9/1986 | Young | 327/541 |
| 4,652,144 | 3/1987 | Günther et al. | 327/512 |

FOREIGN PATENT DOCUMENTS

| | | | |
|---|---|---|---|
| 0341482A1 | 11/1989 | European Pat. Off. | G01K 7/00 |
| 0561461 | 9/1993 | European Pat. Off. | H01L 27/02 |

OTHER PUBLICATIONS

Japanese Patent Abstract No. 01155714 (Fumihiko), dated Jun. 19, 1989.

*Primary Examiner*—Timothy P. Callahan
*Assistant Examiner*—Terry L. Englund
*Attorney, Agent, or Firm*—Herbert L. Lerner; Laurence A. Greenberg; Werner H. Stemer

[57] ABSTRACT

The circuit configuration for sensing when a critical temperature of a component has been exceeded makes use of at least one sense transistor which has a temperature-dependent current/voltage characteristic and which is thermally connected to the component. A current source is connected in series with the sense transistor. A circuit device for compensating for parasitic leakage currents at the sense transistor is provided. The circuit device has a measurement transistor and two current mirror circuits. By compensating for leakage currents, the proper operation of the temperature sensor is guaranteed over the entire temperature range and the destruction of the component is prevented.

5 Claims, 2 Drawing Sheets

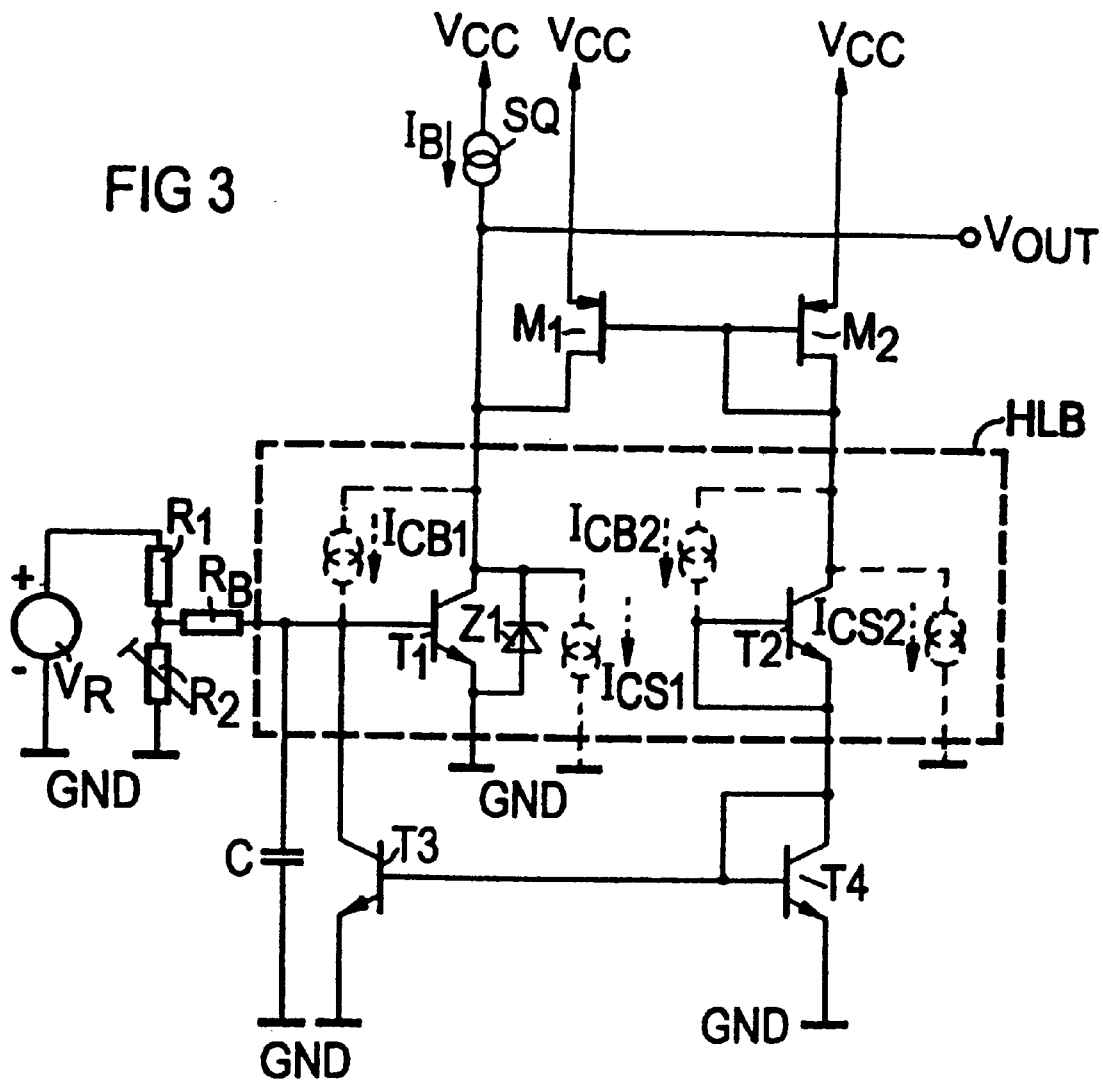

CIRCUIT CONFIGURATION FOR SENSING WHEN A CRITICAL TEMPERATURE OF A COMPONENT HAS BEEN EXCEEDED

BACKGROUND OF THE INVENTION

FIELD OF THE INVENTION

The invention relates to a circuit configuration for sensing when a critical temperature of a component has been exceeded. At least one sense transistor with a temperature-dependent current/voltage characteristic is thereby thermally connected to the component. A current source is connected in series with the sense transistor.

A circuit configuration of that type is disclosed, for example, in European published application EP 0 341 482 A1.

The principle of a temperature sensor of the above-mentioned type is best explained with reference to FIG. 1 of the drawing: The circuit in FIG. 1 has a bipolar transistor $T_1$ with a current source SQ connected in series. The bipolar transistor $T_1$ is thermally connected to the semiconductor component, e.g. a power MOSFET or a power IC, which is to be monitored for overheating. The current source SQ may be a MOS semiconductor component, for example using an n-channel depletion-type transistor. The series circuit comprising the current source SQ and the bipolar transistor $T_1$ is connected between the terminals of a first and a second supply potential $V_{CC}$, GND. The base of the transistor $T_1$ is connected to a reference voltage source VR.

The current source SQ supplies the bipolar transistor $T_1$ with a constant current $I_B$. At the same time, a constant base voltage is impressed on the base terminal of the transistor $T_1$ by the reference voltage source VR. At low temperatures, the bipolar transistor $T_1$ is off and its collector potential $V_{Out}$ corresponds to the value of the operating voltage. With rising temperature and constant base-emitter voltage, if the ability of the bipolar transistor to draw collector currents exceeds the ability of the current source SQ to supply constant current, the collector potential switches to LOW at the output of the temperature sensor configuration. By appropriately selecting the reference voltage $V_R$ at the base, the turn-off temperature can be selected to suit specific requirements.

Such a temperature sensor configuration must reliably register the temperature of a semiconductor component HLB. If the semiconductor component HLB overheats, then the configuration must produce a signal that switches off the semiconductor component HLB. If this does not happen, the semiconductor component HLB may be destroyed.

If a pn-junction is reverse-biased, the applied reverse voltage causes pairs of electron holes, which are produced throughout the diode by thermal generation, to be separated at the edges of the space charge zone, and the minority carriers to be pulled away via the space charge zone. Recombination drops off in the face of thermal generation. If the temperature rises, generation also increases, more minority carriers pass through the space charge zone and the current rises exponentially.

The parasitic depletion layer leakage current is negligible at room temperature. However, the parasitic leakage current reaches dangerously high values at higher temperatures, usually at temperatures above 150° C. For example, the parasitic collector-substrate current $I_{CS1}$ in a conventional npn-bipolar transistor at 300° C. is as much as about 30 mA. The parasitic collector-base current $I_{CB1}$ also reaches undesirable levels.

Reliably registering the temperature of a semiconductor component is possible only to a limited extent, however. Particularly at temperatures above 150° C., parasitic depletion layer leakage currents take effect to an increasing degree. These parasitic leakage currents significantly impair the operation of the temperature sensor and can even render it inoperative. Particularly at very high temperatures, this can even result in the destruction of the semiconductor component HLB.

SUMMARY OF THE INVENTION

It is accordingly an object of the invention to provide a circuit configuration for sensing when a specified temperature for a semiconductor component has been exceeded, which overcomes the above-mentioned disadvantages of the heretofore-known devices and methods of this general type and which provides a compensation for the above-mentioned parasitic leakage currents by means of simple circuitry.

With the foregoing and other objects in view there is provided, in accordance with the invention, a circuit configuration for sensing when a critical temperature of a component has been exceeded, comprising:

At least one sense transistor for sensing a temperature of a component, the sense transistor having a temperature-dependent current/voltage characteristic and being in thermal contact with the component;

a current source connected in series with the sense transistor; and a circuit device connected to the sense transistor for compensating for parasitic leakage currents at the sense transistor.

In other words, the object of the invention is satisfied with a circuit device for compensating for parasitic leakage currents at the sense transistor.

An advantage of the novel circuit configuration is that the parasitic leakage currents at the sense transistor are fully compensated for, and this guarantees that the temperature sensor is fully operational over the entire temperature range of the temperature sensor.

A further significant advantage of the present invention is the simple circuitry with which it is produced. Although the parasitic leakage currents can be reduced in the prior art, the circuitry used for achieving the reduction is complex. In addition, the parasitic leakage currents can never be completely eliminated over the entire temperature range.

In accordance with another feature of the invention, the component is a semiconductor component. Typically, it is preferred to use a power semiconductor component in this case, for example a DMOS transistor or an SPT transistor. However, the invention also proves advantageous for applications using other components, which are not necessarily composed of semiconductor material.

In accordance with an added feature of the invention, the sense transistor is a bipolar transistor. The sense transistor is typically an npn-bipolar transistor. Of course, it is also possible to produce the sense transistor as a pnp-bipolar transistor or using a similar semiconductor component.

In accordance with an additional feature of the invention, the circuit device for compensating for parasitic leakage currents comprises at least one of the following features:

a measurement transistor in thermal contact with the semiconductor component and disposed symmetrically with respect to the sense transistor, the measurement transistor and the sense transistor being of identical construction;

a first current mirror circuit connected between the bases of the sense and measurement transistors and a first supply potential; and a second current mirror circuit connected between the collectors of the sense and measurement transistors and a second supply potential.

In a typical embodiment, the circuit configuration has a measurement transistor and two current mirror circuits. The measurement transistor is advantageously disposed in the immediate vicinity of the sense transistor, so that it is exposed to the same ambient temperature. The measurement transistor measures the parasitic leakage currents at the sense transistor. The two current mirror circuits can be used to compensate for the parasitic collector-base leakage current as well as the parasitic collector-substrate leakage current. It is particularly advantageous if the measurement transistor is of the same conductivity type as, and of identical construction to, the sense transistor.

However, in a further embodiment, it is also conceivable for a number of sense transistors and a number of current mirror circuits for compensating for parasitic leakage currents to be arranged in the immediate vicinity of the sense transistor. This enables measurement inaccuracies which occur when an individual measurement transistor is used to be averaged, and the overall error can therefore be reduced.

In accordance with a further feature of the invention, there is provided a voltage divider connected in parallel with a base-emitter path of the sense transistor. In a preferred embodiment of the invention, the voltage divider can be calibrated. The base of the sense transistor is thus driven from the reference voltage source through the voltage divider. Advantageously, the resistor is a calibratable voltage divider. By dimensioning the voltage divider's resistance appropriately, the switching temperature and hence the response characteristics of the temperature sensor configuration can be set in a defined manner.

In accordance with again a further feature of the invention, a capacitor is connected in parallel with the base-emitter path of the sense transistor. The capacitor makes it possible to render noise voltages originating from the supply voltage source essentially harmless.

In accordance with again another feature of the invention, the current source is a field-effect controlled semiconductor component. Typically, an MOSFET is most often provided here. It is also conceivable to produce the current source using other means, however.

In accordance with a concomitant feature of the invention, a Zener diode is connected in parallel with the collector-emitter path of the sense transistor. Instead of the Zener diode, other means for voltage limiting are also conceivable, however.

In the case of BICD-MOS applications, in particular, very great importance attaches to temperature sensors which recognize that an integrated DMOS power transistor has overheated, for example, and switch off the associated driver circuit. The driver circuit includes a current limiting at about 2 A. As protection against short circuits is required at 40 volts drain-source voltage, it is necessary to arrange the temperature sensor at the potentially hottest point of the semiconductor component, i.e. in the center of the DMOS power transistor. Otherwise, the propagation time of the thermal wave from the hottest point of the temperature sensor would bring about the thermal destruction of the power transistor even before the temperature sensor had recognized that it had overheated.

A further requirement for the temperature sensor arises when there is no short circuit. In this case, the temperature sensor must be capable of operating under the condition $V_{DS} \approx 18$ V, $I_D \approx 2$ A, for example when the turn-on time is at least 2 ms, with no response from the temperature sensor when there is no short circuit. As a result of the power loss in the case of an assumed transistor area of 0.8 mm$^2$, the temperature at the edge of the transistor can be about 200° C. depending on the starting temperature, whilst the temperature in the center of the transistor is about 300° C. after the time mentioned. Although the high temperatures mentioned do not present any reliability problem here, since they can occur at most 100 times for a maximum of 2 ms over the entire lifetime of the integrated circuit, the matter of fundamental importance for such temperature measurement is that it takes place in a defined manner. In particular, such requirements are demanded for the specification of an air bag sensor.

Other features which are considered as characteristic for the invention are set forth in the appended claims.

Although the invention is illustrated and described herein as embodied in a circuit configuration for determining when a critical temperature of a component has been exceeded, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a circuit diagram of a further exemplary embodiment of a novel temperature sensor with full compensation.

DESCRIPTION OF THE PREFERRED EMBODIMENTS

Figure 1:
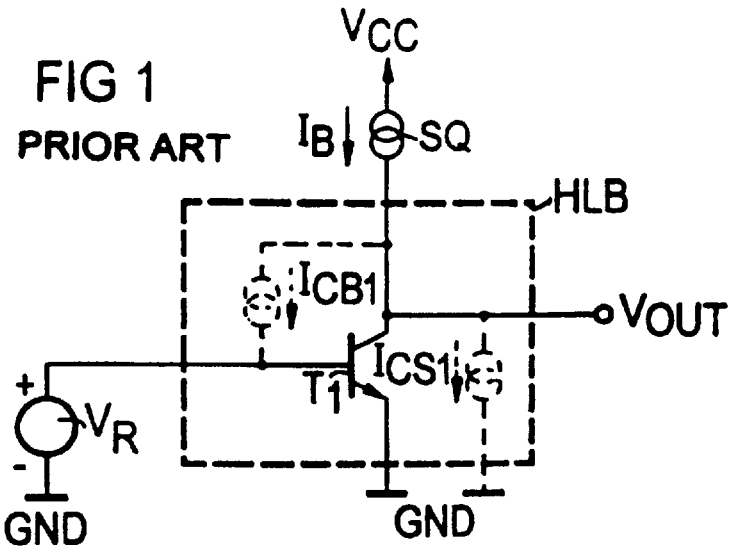
FIG. 1 is a basic circuit diagram of a prior art temperature sensor.
Figure 2:
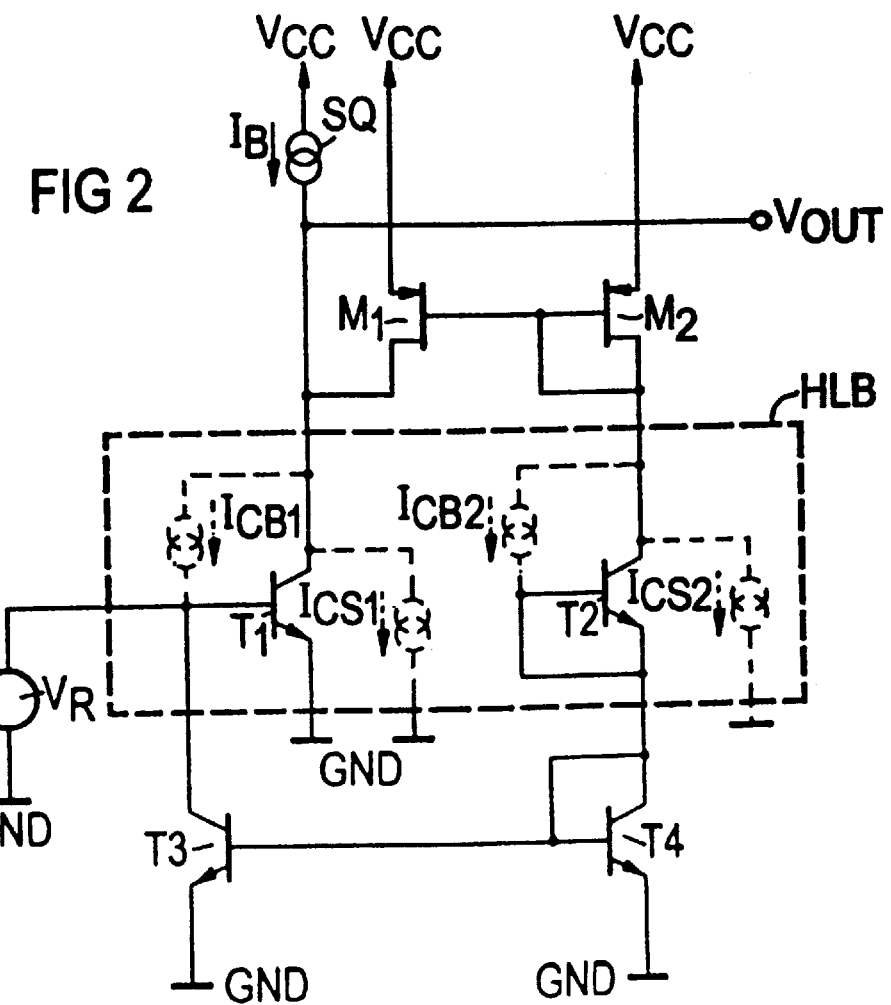
FIG. 2 is a circuit diagram for a novel temperature sensor with circuitry fully compensating for parasitic leakage currents.

Referring now to the figures dealing with the preferred embodiments in detail and first, particularly, to FIG. 2 thereof, there is seen a temperature sensor according to the invention with full compensation. Elements which are the same or have the same functions as in FIG. 1 are provided with the same reference symbols.

FIG. 2 shows a sense transistor $T_1$ arranged in the center of a semiconductor component HLB, for example a DMOS transistor. The sense transistor $T_1$ is thermally connected to the semiconductor component HLB.

The emitter of the sense transistor $T_1$ is connected to the terminal for a first reference ground potential GND. The collector of the sense transistor is connected to the terminal for a second reference potential $V_{CC}$ via the current source SQ. The base of the sense transistor $T_1$ is likewise connected to the terminal for the first reference ground potential GND via a reference voltage source $V_R$. The output signal from the temperature sensor configuration can be tapped off at the collector of the sense transistor $T_1$.

In the present case, the sense transistor $T_1$ is an npn-bipolar transistor, but it can also be produced using a pnp-transistor. The first supply potential GND is in this case the reference ground potential. In an advantageous embodiment, the current source SQ can also be produced using a switchable field-effect controlled semiconductor component, for example using an n-channel depletion-type MOSFET.

A measurement transistor $T_2$ is connected in parallel with the emitter-collector load path of the sense transistor $T_1$. The base-emitter junction of the measurement transistor $T_2$ is short-circuited in this case. It is fundamental to the invention here that the measurement transistor $T_2$ is arranged in the immediate vicinity of the sense transistor $T_1$ and is likewise thermally connected to the semiconductor component HLB. In addition, it is fundamental to the invention that the measurement transistor $T_2$ is of the same conductivity type as the sense transistor $T_1$ (in the present example it is an npn-bipolar transistor), and it is of identical construction to the sense transistor $T_1$.

A first current mirror circuit is connected between the base terminals of the sense transistor $T_1$ and of the measurement transistor $T_2$ and the connection for the first supply potential GND. In this case, the first current mirror circuit comprises two npn-bipolar transistors $T_3$, $T_4$. However, the first current mirror circuit can also be produced using other transistor types, for example MOSFETs. The use of bipolar transistors is to be preferred in the present exemplary embodiment, however, on account of their more favorable voltage ratios.

A second current mirror circuit is arranged between the collector connections of the sense transistor $T_1$ and of the measurement transistor $T_2$ and the connection for the second supply potential $V_{CC}$. In the present example, the second current mirror circuit is produced using two p-MOS junction transistors $M_1$, $M_2$. However, it is also conceivable for the transistors $M_1$, $M_2$ in the second current mirror circuit to be produced likewise as bipolar transistors.

In addition, the parasitic collector-base leakage currents $I_{CB1}$, $I_{CB2}$ and the parasitic collector-substrate leakage currents $I_{CS1}$ $I_{CS2}$ at the sense transistor $T_1$ and at the measurement transistor $T_2$ are shown in FIG. 2.

The way in which the temperature sensor configuration according to the invention operates is explained in greater detail below.

The measurement transistor $T_2$ for determining the parasitic currents is arranged adjacent to the sense transistor $T_1$ in the center of the semiconductor component HLB. The two transistors $T_1$, $T_2$ are of the same conductivity type and arranged symmetrically in such a manner that they are at the same ambient temperature as far as possible. Their leakage currents $I_{CB1}$, $I_{CB2}$ and $I_{CS1}$, $I_{CS2}$ are therefore virtually identical. This condition is true even if the corresponding reverse voltages $V_{CB}$ and $V_{CS}$ at the two transistors are different, since the voltage dependency of the reverse current is largely negligible.

The second current mirror $M_1$, $M_2$ mirrors the leakage current $I_{CS2}$ from the measurement transistor $T_2$ to the collector of the sense transistor $T_1$. This compensates for the collector-substrate reverse current $I_{CS1}$ in the sense transistor $T_1$. The collector-base leakage current $I_{CB1}$ is rendered inactive by the bipolar current mirror $T_3$, $T_4$ and the leakage current $I_{CB2}$ impressed on the primary side, in such a manner that the current balance of the leakage currents $I_{CB1}$–$I_{CB2}$ at the base of the sense transistor $T_1$ is likewise equal to 0.

The sense transistor $T_1$ is consequently provided, over the entire temperature range, with the same current supply at the collector as is impressed by the current source SQ. The impressed base-emitter voltage therefore remains constant irrespective of the temperature.

By appropriately selecting the base-emitter voltage and the impressed current from the current source SQ, the temperature turn-off value can be dimensioned as intended.

FIG. 3 shows an advantageous development of the temperature sensor configuration according to the invention having fully compensated leakage currents as shown in FIG. 2. Elements which are the same or have the same function are provided with the same reference symbols as in FIG. 2.

In FIG. 3, a voltage-limiting Zener diode $Z_1$ is additionally provided between the collector-emitter terminals.

Furthermore, a capacitor C is connected in parallel between the base-emitter terminals of the sense transistor $T_1$. The capacitor C renders the interference voltage originating from the supply voltage source essentially harmless.

A voltage divider comprising a first resistor $R_1$ and a second resistor $R_2$ is connected in parallel with the reference voltage source $V_R$. A bulk resistor $R_B$ is connected at the output point between the two resistors $R_1$, $R_2$ and the base of the sense transistor $T_1$. The reference voltage is divided down by means of the voltage divider $R_1$, $R_2$. The voltage is then tapped off via the bulk resistor $R_B$. Advantageously, one of the two resistors $R_1$, $R_2$, in the present case the second resistor $R_2$, is variable. In this way, a defined voltage can be tapped off at the reference voltage source $V_R$. The response characteristics of the temperature sensor can thus be changed easily by means of the rotary voltage divider $R_1$, $R_2$ at the input, which reduces the reference voltage $V_R$ to the required value.

The novel circuit configuration according to the invention is a simple means of compensating for parasitic, temperature-dependent leakage currents. The measure guarantees the operation of the temperature sensor over the entire temperature range.

I claim:

1. A circuit sensor configuration for sensing when a critical temperature of a component has been exceeded, comprising:

a sense transistor for sensing a temperature of the component, said sense transistor having a temperature-dependent current/voltage characteristic and being in thermal contact with the component, said sense transistor having a base and a collector;

a measurement transistor in thermal contact with the component and symmetrically disposed with respect to said sense transistor, said measurement transistor having a base and a collector, said measurement transistor and said sense transistor being of identical construction;

a current source connected in series with said sense transistor; and a circuit device connected to said sense transistor for compensating for parasitic leakage currents at said sense transistor, said circuit device including a first current mirror connected between said base of said sense transistor and said base of said measurement transistor and a first supply potential, said circuit device further including a second current mirror connected between said collector of said sense transistor and said collector of said measurement transistor and a second supply potential;

wherein said sense transistor includes a base-emitter path and a voltage divider connected to the base-emitter path of said sense transistor.

2. The circuit sensor configuration according to claim 1, wherein said voltage divider is calibratable.

3. The circuit sensor configuration according to claim 1, which further comprises a capacitor connected in parallel with said base-emitter path of said sense transistor.

4. The circuit sensor configuration according to claim 1, wherein said current source is a field-effect controlled semiconductor component.

5. The circuit sensor configuration according to claim 1, wherein said sense transistor has a collector-emitter path, and including a Zener diode connected in parallel with said collector-emitter path of the sense transistor.

* * * * *